US010163670B2

(12) United States Patent
Fürfanger et al.

(10) Patent No.: US 10,163,670 B2
(45) Date of Patent: *Dec. 25, 2018

(54) DEVICE AND METHOD FOR HEAT TREATING AN OBJECT

(71) Applicant: Saint-Gobain Glass France, Courbevoie (FR)

(72) Inventors: Martin Fürfanger, Steinhöring (DE); Stefan Jost, München (DE); Jörg Palm, München (DE)

(73) Assignee: Bengbu Design & Research Institute for Glass Industry, Bengbu (CN)

( * ) Notice: Subject to any disclaimer, the term of this patent is extended or adjusted under 35 U.S.C. 154(b) by 691 days.

This patent is subject to a terminal disclaimer.

(21) Appl. No.: 14/413,562

(22) PCT Filed: Jul. 9, 2013

(86) PCT No.: PCT/EP2013/064518
§ 371 (c)(1),
(2) Date: Jan. 8, 2015

(87) PCT Pub. No.: WO2014/009388
PCT Pub. Date: Jan. 16, 2014

(65) Prior Publication Data
US 2015/0206781 A1     Jul. 23, 2015

(30) Foreign Application Priority Data
Jul. 9, 2012   (EP) ...................................... 12175615

(51) Int. Cl.
*F27B 5/02*     (2006.01)
*F27B 5/16*     (2006.01)
(Continued)

(52) U.S. Cl.
CPC .......... *H01L 21/67393* (2013.01); *F27B 5/16* (2013.01); *F27D 7/06* (2013.01);
(Continued)

(58) Field of Classification Search
None
See application file for complete search history.

(56) References Cited

U.S. PATENT DOCUMENTS 6,046,439 A * 4/2000 Johnsgard ........... C23C 16/4411
219/390
2003/0094446 A1* 5/2003 Tay ................... H01L 21/67115
219/411
(Continued)

FOREIGN PATENT DOCUMENTS

CN   102124291 A    7/2011
DE      4324318 C1    1/1995
(Continued)

OTHER PUBLICATIONS

Palm, J., et al., CIS module pilot processing applying concurrent rapid selenization and sulfurization of large area thin film precursors, Thin Solid Films 431-432, 2003, pp. 514-522.

*Primary Examiner* — Joseph M Pelham
(74) *Attorney, Agent, or Firm* — Hodgson Russ LLP

(57) ABSTRACT

The present invention relates to a device for heat treating an object, in particular a coated substrate, with an in particular gas-tightly sealable housing that encloses a hollow space, wherein the hollow space has a separating wall, by which the hollow space is divided into a process space for accommodating the object and an intermediate space, wherein the separating wall has one or a plurality of openings, which are implemented such that the separating wall acts as a barrier for the diffusion out of the process space into the intermediate space of a gaseous substance generated in the process space by the heat treatment of the object. The housing has at
(Continued)

least one housing section coupled to a cooling device for its active cooling, wherein the separating wall is arranged between the object and the coolable housing section. The invention further relates to the use of a separating wall as a diffusion barrier in a device for heat treating an object as well as a corresponding method for heat treating an object.

16 Claims, 5 Drawing Sheets

(51) Int. Cl.
      *F27D 7/06* (2006.01)
      *H01L 21/673* (2006.01)
      *F27B 5/06* (2006.01)

(52) U.S. Cl.
      CPC .. *H01L 21/67353* (2013.01); *F27B 2005/062* (2013.01); *F27B 2005/162* (2013.01); *F27D 2007/063* (2013.01)

(56) References Cited

U.S. PATENT DOCUMENTS

| | | | |
|---|---|---|---|
| 2005/0238476 A1 | 10/2005 | Bernard et al. | |
| 2012/0171632 A1* | 7/2012 | Novak | C03B 27/0404 432/14 |
| 2013/0129329 A1* | 5/2013 | Caspari | H01L 21/67109 392/416 |
| 2013/0216967 A1* | 8/2013 | Furfanger | H01L 21/67109 432/31 |
| 2014/0051265 A1* | 2/2014 | Purshce | H01L 21/67109 438/795 |
| 2015/0165475 A1* | 6/2015 | Palm | H01L 21/67353 427/591 |
| 2015/0197850 A1* | 7/2015 | Jost | H01L 21/67173 427/595 |

FOREIGN PATENT DOCUMENTS

| | | |
|---|---|---|
| DE | 102008022784 A1 | 11/2009 |
| EP | 0662247 B1 | 3/1999 |
| EP | 2200097 A1 | 6/2010 |
| JP | S61-169680 | 7/1986 |
| JP | H04-5480 A | 1/1992 |
| JP | 2011-524644 | 9/2011 |
| KR | 10-2011-0039535 | 4/2001 |
| WO | 01/80291 A1 | 10/2001 |
| WO | 2007/077171 A2 | 7/2007 |

* cited by examiner

DEVICE AND METHOD FOR HEAT TREATING AN OBJECT

The invention relates to a device and a method for heat treating an object, in particular a coated substrate, as well as the use of a separating wall in a gas-tightly sealable housing of a device for heat treating an object as a diffusion barrier.

In multiple technical areas, it is common to subject objects to a heat treatment below the melting temperature ("annealing"), to selectively influence the solid-state structure. One example of this is the annealing of cast-iron to improve the strength and toughness by changing its structure. Also known is the tempering of steel after hardening, wherein internal stresses are degraded, with the hardness of the steel reduced. Also with glass, it is common practice to reduce internal stresses by annealing, for example, to increase the quality of optical components.

Annealing has great significance in semiconductor manufacturing, in particular in the production of thin-film solar cells with an absorber made of a compound semiconductor. Thin precursor layers are applied on a substrate and converted with subsequent rapid thermal processing (RTP) to form the compound semiconductor. Such a procedure is described in detail, for example, in J. Palm et al., "CIS module pilot processing applying concurrent rapid selenization and sulfurization of large area thin film precursors", Thin Solid Films 431-432, pp, 414-522 (2003). Thin-film solar cells per se have already been described frequently in the patent literature. Reference is made, merely by way of example, in this regard to the printed publications DE 4324318 C1 and EP 2200097 A1.

Generally speaking, the annealing of an object is done in a furnace that enables heating the object in accordance with a pre-definable temperature profile to specific temperatures for specific periods of time. Especially in the production of compound semiconductors, it is important that the annealing proceeds in a controlled process atmosphere. For this purpose, it is known to delimit the process space around the substrate coated with the precursor layers by means of a process box. The process box enables keeping the partial pressure of readily volatile chalcogen components such as selenium or sulfur at least largely constant during the heat treatment. Such a process box is known, for example, from DE 102008022784 A1.

In the industrial-scale production of thin-film solar modules, the RTP thermal processing of precursor layers occurs in in-line systems, in which the coated substrates are transported sequentially into various process chambers. Such a method is known, for example, from EP 0662247 B1.

US Patent Application No. 2005/0238476 A1 discloses an apparatus for transporting a substrate in a controlled atmosphere with a housing that includes an evacuable substrate space for the substrate and a secondary space. The substrate space and the secondary space are separated from each other by a separating wall with nanopores, wherein the separating wall forms a micropump based on the Knudsen principle (thermal osmosis). The substrate space has a cooling plate (decontamination plate), wherein the separating wall is arranged not between the substrate and the cooling plate. Instead, the cooling plate is always arranged in a position opposite the substrate. In addition, the secondary space is thermally decoupled from the housing section or substrate space cooled by the cooling plate by the heatable separating wall. Heating is necessary for the pumping mechanism.

In contrast, the object of the present invention consists in advantageously improving the devices and methods known in the prior art for heat treating objects. This and other objects are accomplished according to the proposal of the invention by a device and a method for heat treating an object, as well as by the use of a separating wall in a device for heat treating an object in accordance with the coordinated claims. Preferred embodiments of the invention emerge from the characteristics of the subclaims.

According to the invention, a device is disclosed for heat treating (annealing) any object below its melting temperature.

The device is used, for example, for heat treating a coated substrate, with the term "substrate" referring, in the context of the invention, to a flat object that has two surfaces placed opposite each other, wherein a layer structure including a plurality of layers is typically applied on one of the two surfaces. The other surface of the substrate is usually not coated. For example, it is a substrate for production of a thin-film solar module coated with precursor layers of a compound semiconductor (e.g., a chalkopyrite or kesterite compound) that must be subjected to RTP-thermal processing. In addition, it should be noted that mainly used as absorbers in thin-film solar cells are compound semiconductors made of chalcopyrite compounds, in particular, copper-indium/gallium-disulfur/diselenide, abbreviated as $Cu(In,Ga)(S,Se)_2$, or kesterite compounds, in particular, copper-zinc/tin-disulfur/diselenide, abbreviated as $Cu_2(Zn,Sn)(S,Se)_4$.

The device according to the invention comprises a housing, advantageously, a gas-tightly sealable (evacuable) housing, that encloses a hollow space. For heat treatment of the object, the device can be independently heatable and can, for this purpose, include an internal heating device (e.g., an electric heater) for heating the hollow space. The device is implemented, for example, as a furnace for annealing the object without external heat having to be supplied. Alternatively or additionally, the device can also not be independently heatable, but include at least one housing section that is implemented such that the object is heat treatable through electromagnetic thermal radiation impinging on the housing section.

The device further comprises a separating wall, which is arranged such that the hollow space is divided into a process space for accommodating the object to be treated with heat and an intermediate space. The separating wall has one or a plurality of openings, which are implemented such that the separating wall acts as a barrier for the diffusion out of the process space into the intermediate space of a gaseous substance generated in the process space by the heat treatment of the object.

It is essential here that the separating wall serves, on the one hand, as a diffusion barrier (vapor barrier) for a gas exchange between the process space and the intermediate space during the heat treatment the object, but enables a gas exchange between the process space and the intermediate space before and after the heat treatment such that pumping out of gaseous substances from the process space, purging with a purge gas, as well as filling with a process gas through the separating wall is possible. The process space and the intermediate space are fluidically connected to each other by the one or a plurality of openings or breaks in the separating wall. Generally speaking, the openings can have any shape, for example, a slot shape or a round hole shape, and can even be arranged on the periphery.

In one advantageous embodiment, the separating wall does not reach all the way to a housing wall such that an opening, in particular, a gap, remains between the separating wall and the housing wall.

For example, but not absolutely necessarily, one smallest dimension, for example, a radius or diameter of a respective opening of the separating wall is greater than the length of the mean free path of the gas particles in the process space.

In particular, the separating wall can be made of a porous material or a material provided with tubes (straight, oblique, or angled tubes) or include such a material.

Thus, a process space for heat treating the object is formed by the separating wall, which process space is separated quasi-gas-tightly from the intermediate space by the separating wall. In contrast to an open process space, which permits a free gas exchange between the process space and the external surroundings, as well as to a gas-tight process space, in which such a gas exchange between the process space and the external surroundings is completely suppressed, the gas exchange between the process space and the intermediate space is inhibited by the separating wall. This vapor barrier is based on the pressure dependency of the length of the free path: at approximately normal pressure (700-1000 mbar), the diffusion through the comparatively small openings is inhibited. If, in contrast, the intermediate space is evacuated to pressures in the pre-vacuum range (10-1000 µbar), the free path length is greatly increased and the separating wall represents only a weak diffusion barrier for the gas exchange.

The process space can be pumped out through the separating wall and after the pumping out, process gas can also flow into the process space. In the production of compound semiconductors, the process gas can, for example, contain reactive gases such as $H_2S$, $H_2Se$, S vapor, Se vapor, or $H_2$ as well as inert gases such as $N_2$, He, or Ar. In particular, by means of the quasi-gas-tight separating wall, the partial pressure of readily volatile chalcogen components such as selenium or sulfur can be kept at least largely constant during the heat treatment of precursor layers in the process space. The volatile chalcogen components develop in the process space, for example, from material that is applied on the coated substrate.

In order to be able to pump out the hollow space and fill it with a purge gas or a process gas, the preferably gas-tightly sealable housing of the device can include at least one sealable gas passage that opens into the hollow space (for example, by means of a valve). The gas passage can open, for this purpose, in particular into the intermediate space.

By means of the device according to the invention, multiple advantages can thus be obtained, among which it must be emphasized that the process atmosphere can be kept at least largely constant with regard to volatile components that develop in the process space. In addition, during the heat treatment of objects, the intermediate space can be protected against the often corrosive gases in order to expose sensors contained therein to no excessive wear. With such a design, evacuation of the hollow space of the device can be obtained quickly and efficiently. This applies equally to filling with process gas, with the process gas cost-effectively usable in minimal quantity.

As already mentioned, by means of the separating wall, a quasi-gas-tight division of the hollow space into a process space and an intermediate space is obtained, wherein the separating wall is provided for this purpose with one or a plurality of openings. Preferably, the separating wall is implemented such that during the heat treatment a loss in mass of a gaseous substance generated by the heat treatment of the object out of the process space is less than 50%, preferably less than 20%, more preferably less than 10%, of the mass of the gaseous substance generated during the heat treatment.

Advantageously, the separating wall is implemented for this purpose such that an area ratio, formed from a (total) opening area of the one or a plurality of openings divided by an inner surface (interior area) of the process space, is in the range from $5\times10^{-5}$ to $5\times10^{-4}$. Thus, it can advantageously be achieved that the (total) opening area of the one or a plurality of openings of the separating wall is, on the one hand, adequately large to enable a rapid evacuation of the process space as well as a filling with purge gas or process gas and is, on the other, adequately small such that the separating wall serves as an effective vapor barrier or diffusion barrier for volatile components generated in the process space during the heat treatment.

In a particularly advantageous embodiment of the device according to the invention, the separating wall is made of a material or contains at least one such material that has such a coefficient of thermal expansion that a (total) opening area of the one or a plurality of openings is reduced by heating the separating wall during the heat treatment to a maximum of 50%, preferably a maximum of 30%, more preferably a maximum of 10%, of the starting value (total opening area before the heat treatment). Advantageously, for this purpose, this material of the separating wall has a coefficient of thermal expansion of more than $5\times10^{-6}$ $K^{-1}$. In this manner, a temperature-controlled separating wall is created with which, on the one hand, an especially efficient pumping out of the process space as well as filling of the process space with purge gas or process gas is obtained in the cold state through a larger (total) opening area; on the other hand, an especially effective inhibition of the diffusion from the process space into the intermediate space of gaseous substances generated during the heat treatment is obtained in the warmer state during the heat treatment by thermal expansion through a smaller (total) opening area. In particular, the separating wall can be implemented such that during the heat treatment, the (total) opening area is reduced at least approximately to zero, such that a gas exchange between the process space and the intermediate space is almost completely suppressed during the heat treatment.

Advantageously, the housing of the device is made of a material or contains at least one such material whose coefficient of thermal expansion is less than $5\times10^{-6}$ $K^{-1}$, for example, quartz glass.

In another particularly advantageous embodiment of the device according to the invention, the housing has at least one (first) housing section coupled to a temperature controlling or cooling device for its temperature control or active cooling, wherein the separating wall is arranged between the object and the temperature-controllable or actively coolable housing section. The temperature control or cooling) at least of one housing section of the device enables reduced wear of vacuum-compatible components during the heat treatment. Undesirable condensation of volatile components developing during the heat treatment on the temperature-controlled (actively cooled housing section can be prevented by the separating wall acting as a diffusion barrier or vapor barrier in order to thus minimize the loss of volatile components in the process atmosphere and to keep their partial pressure in the process atmosphere at least largely constant. In particular, in the production of compound semiconductors, the consumption of volatile chalcogen elements can be minimized and the quality of the compound semiconductors produced can be improved.

Furthermore, the housing includes one or a plurality of (second) housing sections that are not temperature-controllable or coolable, i.e., not coupled to the temperature-controlling or cooling device, which are, in particular, those housing sections that enable heat treatment by electromagnetic thermal radiation impinging on the housing section, in other words, for example, which lie in the radiation field of the radiant heaters. The first housing sections are different from the second housing sections. The first housing sections are connected or connectable to the cooling device and can, consequently, be cooled, whereas the second housing sections are not connected to the cooling device and, consequently, cannot be cooled.

The temperature-controllable or coolable (first) housing sections are actively coolable, in comparison with the temperature of the substrate and of those housing sections, that enable heat treatment by incident electromagnetic thermal radiation, and are situated, for example, in the radiation field of the radiant heaters. The temperature-controllable or coolable (first) housing sections can be temperature controlled (actively cooled) before, during, and/or after a heat treatment of the coated substrate.

As used here and in the following, the term "coolable" refers to temperature controlling of the housing section to a temperature that is lower than the temperature of the object during heat treatment or, in the case of a device not independently heatable, to those housing sections that enable heat treatment by incident electromagnetic thermal radiation and lie in the radiation field of the radiant heaters. For example, the temperature-controlled housing section is temperature controlled to a temperature in the range from 20° C. to 200° C. Because of this temperature control or cooling, the plastic seals customary in vacuum technology (elastomers, fluoroelastomers) and other comparatively economical standard components can be used for the vacuum sealing of the device, which, however, do not withstand temperatures above 200° C. long-term.

In another particularly advantageous embodiment of the device according to the invention, the hollow space includes, during the heat treatment of the object, a warmer zone and at least one colder zone, whereby the separating wall is arranged between the warmer zone and the at least one colder zone, in order to separate the warmer zone from the at least one colder zone. For example, the device is implemented in the form of a zoned furnace, which has one warmer or hottest core zone, which serves as a processing zone for the processing of an object, which is surrounded by colder edge zones. The core zone separated from the two edges loans by the separating wall, i.e., the separating wall arranged between core and edge zones. Advantageously, by means of the separating wall, undesirable condensation on the wall sections of the colder edge zones of volatile components developing in the core zone during heat treatment can be prevented.

The device according to the invention includes, for example, a housing with a, for example, one-piece housing section and a housing opening for the introduction of the object into the process space or removal of the object object from the process space, as well as a seal for sealing the housing opening. The separating wall is, for example, parallel to the seal. For example, the seal is temperature-controllable or coolable, with, in this case, the housing section coupled to a cooling device being the seal for sealing the housing opening.

In a particularly advantageous embodiment of the invention, the housing section coupled to a cooling device is a side wall section, in particular, a frame of the housing connecting a side wall section of a bottom wall and top wall to each other. Advantageously, the housing section coupled to a cooling device comprises or includes a seal for sealing a housing opening.

In another advantageous embodiment of the invention, the housing section coupled to a cooling device has a sealable gas passage that opens into the intermediate space (for example, through a valve), for removing/feeding at least one gaseous substance (e.g., evacuating and introducing process gas). Such a gas passage is, for example, provided with a gas connection, in particular a valve for controlling the gas flow. As a result of the cooling of the housing section, plastic seals customary in vacuum technology and other com delete paratively cost-effective standard components can be used for the vacuum sealing of the device. In particular, the cooled housing section with a gas passage is the seal for sealing the housing opening.

A not independently heatable device according to the invention for heat treating an object can, for example, be implemented as a preferably gas-tightly sealable (evacuable) process box for accommodating at least one flat substrate, in particular for producing thin-film solar cells. The clear height of the hollow space is preferably dimensioned such that gases can be pumped out in the shortest possible time and the high demands with regard to oxygen content and partial water pressure during RTP thermal processing can be met. The housing can, in principle, be made from any material suitable for the intended use, for example, metal, glass, ceramic, glass ceramic, carbon fiber reinforced carbon materials, or graphite.

It is essential here that the housing of the process box have one or plurality of housing sections, which are in each case implemented to enable heat treatment by means of electromagnetic thermal radiation incident on the housing section. The housing sections serving for heat treatment can be, for this purpose, transparent, partially transparent, or opaque to electromagnetic thermal radiation for processing the substrate. For example, the housing sections serving for heat treatment are made of glass ceramic. The housing sections serving for heat treatment can, in particular, even contain a material (e.g., graphite) or be made of a material that is suitable to at least partially, in particular, completely, absorb the electromagnetic thermal radiation of radiant heaters in order to be heated themselves. The heated housing section can then serve as a secondary heat source for heating the substrate, which can, in particular, result in homogenization of the heat distribution.

The housing has, accordingly, at least one housing section coupled to a heating device, such as, for example, radiant heaters, for heating the process space. In addition, the housing of the process box can include one or a plurality of temperature-controllable or coolable housing sections, whose temperature can be set to a pre-definable temperature value. The housing sections are, for this purpose, thermotechnically coupled in each case to an (external) temperature-controlling or cooling device. Moreover, the housing of the process box includes in this case one or plurality of non-temperature-controllable (i.e., not coupled to the temperature controlling or cooling device) housing sections, which are, in particular, those housing sections that enable heat treatment by means of electromagnetic thermal radiation incident on the housing section, in other words, lie in the radiation field of the radiant heaters. The process space is enclosed exclusively by the at least one separating wall and one or a plurality of housing sections of the process box that are not temperature-controllable or coolable.

The invention further extends to the use of a separating wall implemented as described above in an in particular gas-tightly sealable housing of a device implemented as described above for heat treating an object.

The invention further extends to a method for heat treating an object, in particular a coated substrate, in which an object is introduced into a hollow space of an in particular gas-tightly sealable housing, wherein the hollow space is divided by a separating wall, which has one or a plurality of openings, into a process space accommodating the object and an intermediate space, and the object is heat treated, with the separating wall acting as a barrier for the diffusion out of the process space into the intermediate space of a gaseous substance generated in the process space by the heat treatment.

In an advantageous embodiment of the method according to the invention, a total opening area of the one or a plurality of openings of the separating wall is reduced by heating the separating wall during the heat treatment to a maximum of 50%, preferably a maximum of 30%, more preferably a maximum of 10% of a total opening area before the heat treatment.

In another advantageous embodiment of the method according to the invention, at least one housing section adjacent the intermediate space, in particular a seal for sealing a housing opening which has, in particular, a gas passage that opens into the intermediate space for the removing/feeding of at least one gaseous substance, is temperature-controlled or cooled during the heat treatment of the object.

In another advantageous embodiment of the method according to the invention, the hollow space of the housing provided with the object is pumped out, in particular before and/or after the heat treatment, and is filled with at least one gas. Advantageously, the process space is pumped out by removal of at least one gaseous substance from the intermediate space and/or at least one gaseous substance is fed to the process space by introduction into the intermediate space.

The advantages of such a method have already been described in connection with the device according to the invention; to avoid repetitions, reference is made to the statements in this regard.

It is understood that the various embodiments of the invention can be realized individually or in any combinations. In particular, the above-mentioned characteristics and those to be explained below can be used not only in the combinations indicated but also in other combinations or in isolation without departing from the scope of the present invention.

BRIEF DESCRIPTION OF THE DRAWINGS

The invention is now explained in detail with reference to the accompanying figures. They depict, in simplified representation not true to scale.

Figure 1:
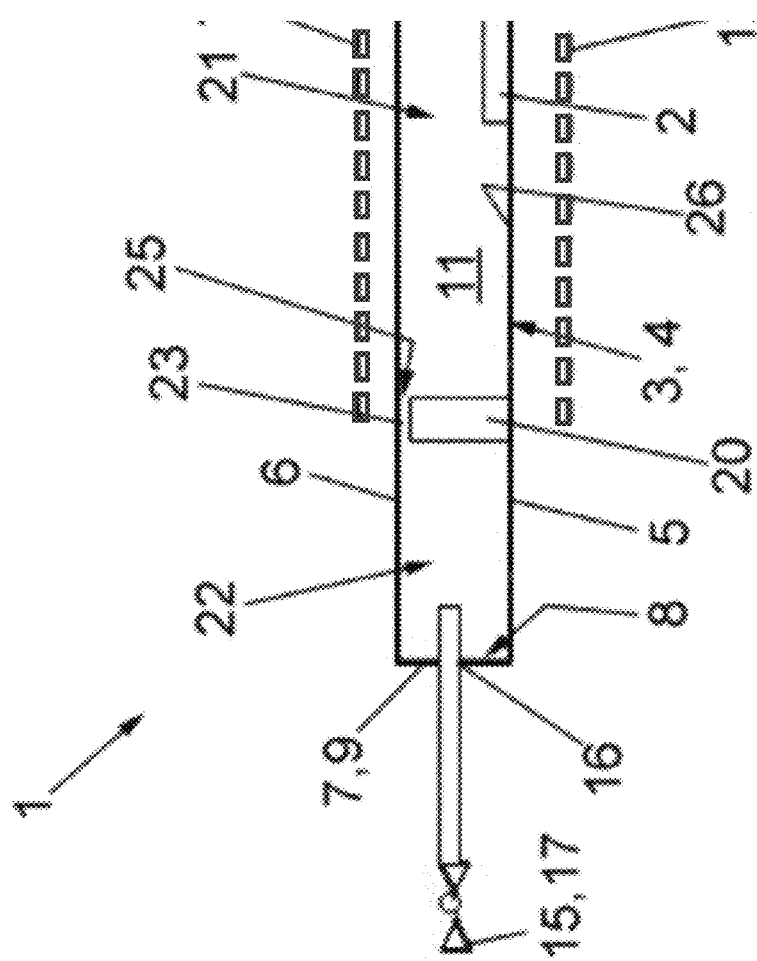
FIG. 1 a generalized cross-sectional representation of a device for processing a coated substrate.
Figure 2:
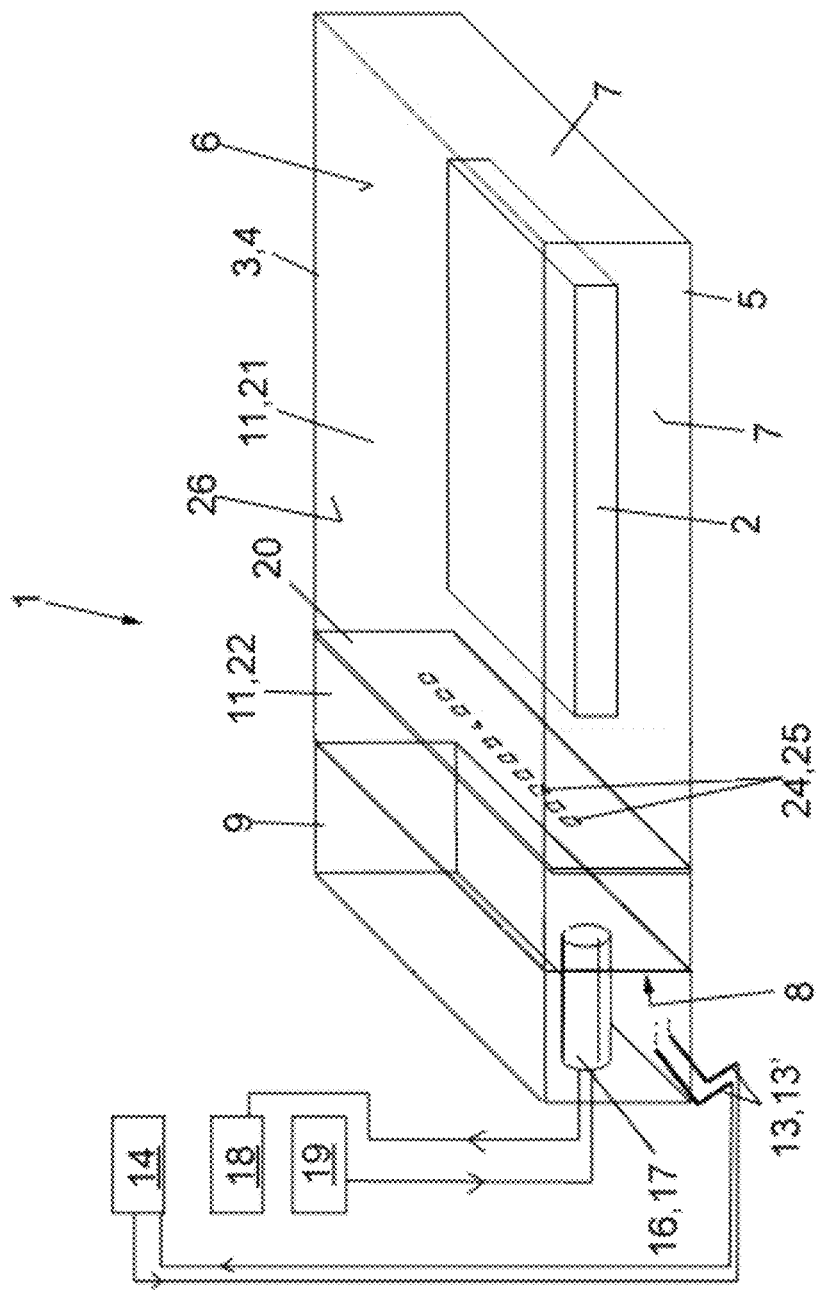
FIG. 2 a perspective view of the device of FIG. 1 with a front seal.

Reference is made first to FIGS. 1 and 2, in which a generalized sectional view of a device 1 for processing an object 2 (FIG. 1), as well as a perspective view of such a device 1 with a front seal 9 (FIG. 2) is depicted. The device 1 serves, for example, for processing a substrate coated on one side for heat treating precursor layers for conversion into a compound semiconductor, in particular, a chalcopyrite compound. Although only a single substrate is depicted, the device 1 could likewise be used for processing two or more substrates. The substrate is made, for example, of glass with a thickness in the range from 1 mm to 4 mm, in particular 2 mm to 3 mm. The substrate is provided with a layer structure (not shown in detail), which consists, for example, of precursor layers of an absorber (e.g., chalcopyrite compound or kesterite compound), which must be subjected to RTP thermal processing. For example, the layer structure is a sequence of the layers silicon nitride/molybdenum/copper-indium-gallium/selenium. For example, the silicon nitride layer has a thickness in the range from 50 nm to 300 nm; the molybdenum layer, a thickness in the range from 200 nm to 700 nm; the copper-indium-gallium layer, a thickness in the range from 300 nm to 1000 nm; and the selenium layer, a thickness in the range from 500 nm to 2000 nm.

The device 1 comprises here, for example, a rectangular-solid-shaped housing 3 with a housing wall 4, composed of a bottom wall 5, a top wall 6, and a peripheral side wall 7. The housing wall 4 encloses a gas-tight or evacuable hollow space 11, which is gas-tightly sealable by a removable seal 9. As depicted in FIG. 2, the housing 3 can have, for example, a front housing opening 8, which is sealable by a seal 9 mountable like a door, which forms a part of the side wall 7. Generally speaking, the housing opening 8 and the associated seal 9 can be selectively placed on any wall section of the housing wall 4. The bottom wall 5 serves in a central zone as a supporting surface for the substrate 2, with it being likewise possible also to provide corresponding spacers or support elements.

The housing wall 4 of the process box 1 can be made of the same material or from materials different from each other, for example, metal, glass, ceramic, glass ceramic, carbon fiber reinforced carbon materials, or graphite.

In the example illustrated in FIG. 2, the device 1 serves as a not independently heatable process box for heat treating the object 2 realized as a substrate. It is essential that at least one housing section, here, for example, the top wall 6 and the bottom wall 5 are in each case implemented such that heat treatment of the coated substrate by thermal energy fed in from the outside in the form of electromagnetic thermal radiation is possible. The thermal energy can be fed in by radiant heaters 12 arranged, for example, in rows above the top wall 6 as well as below the bottom wall 5. For example, the top wall 6 and the bottom wall 5 are made, for this purpose, from a material that is transparent or at least partially transparent to the electromagnetic radiation radiated in, for example, glass ceramic. The top wall 6 and the bottom wall 5 can also be made of such a material only in sections. It is also equally possible that the top wall 6 and the bottom wall 5 are made of a material that is suitable to at least partially, in particular completely, absorb the electromagnetic radiation in order to be heated themselves, for example, graphite. In this case, the top wall 6 and the bottom wall 5 serve as passively heated, secondary heat sources.

As is discernible in FIG. 2, the housing wall 4, here, for example, the seal 9, is provided with two coolant connections 13, 13', which serve as an inlet or an outlet for coolant in a coolant line system (not shown in detail) running through the peripheral side wall 7 at least in sections, in particular completely. By means of the coolant introduced, the side wall 7 can be temperature controlled at least in sections, in particular completely, to a pre-definable temperature (actively cooled relative to the substrate temperatures during the heat treatment). The two coolant connections 13, 13' can be fluidically connected for this purpose to a temperature controlling device or cooling device 14 for preparation and cooling of the coolant. In general, in the device 1, only those housing sections that do not serve for heat treating the coated substrate are temperature controlled, by thermal energy fed in from outside in the form of electromagnetic thermal radiation, here, for example, the peripheral side wall 7 or at least a section thereof. In the present example, only the seal 9 is temperature controlled (cooled). Oil or water, for example, can be used as coolant. The temperature control or active cooling can alternatively also be obtained through contact cooling (heat conduction) through contact with heat sinks (for example, cooling plates), a blower (convection cooling) or without contact by spaced heat sinks (radiative cooling).

The housing 3 further comprises a gas passage 16 provided with a valve 15 that opens into the hollow space 11. Here, the gas passage 16 is arranged, for example, in the front seal 9. The hollow space 11 can be evacuated via a gas connection 17 by connection to a pumping out device 18 (e.g., vacuum pump). Also, the gas connection 17 can be connected to a gas supply device 19 in order to purge the hollow space 11 by introduction of an inert purge gas and/or to fill it with a reactive process gas. Filling with the process gas can be done at negative or positive pressure. By means of the valve 15 (for example, a multipath valve), the gas passage 16 can be selectively opened or gas-tightly sealed. The hollow space 11 has a relatively low clear height, for example, in the range from 7 to 12 mm, in order to enable rapid evacuation and efficient filling with process gas.

The hollow space 11 is divided quasi-gas-tight by a strip-shaped separating wall 20 into a process space 21 and an intermediate space 22, with object 2 implemented as a coated substrate accommodated only in the process space 21. The gas passage 16 opens into the intermediate space 22. The separating wall 20 is provided with one or a plurality of openings or breaks, by means of which the process space 21 is fluidically connected to the intermediate space 22.

As is discernible in the vertical sectional view of FIG. 1, the separating wall 20, which extends vertically from the bottom wall 5 in the direction of the top wall 6, does not reach all the way to the top wall 6, such that a gap 23 remains as an opening of the separating wall 20. FIG. 2 depicts a variant of the separating wall 20 in which the separating wall 20 extends all the way to the top wall 6 and is provided with a plurality of horizontal slots 24 arranged roughly centrally in a row. Through the gap 23 or the slots 24, the process space 21 is fluidically connected to the intermediate space 22 such that a mutual gas exchange is possible but is inhibited because of the small vertical dimension or height of the gap 23 or slots 24. The separating wall 20 thus acts as a diffusion barrier or a vapor barrier between the process space 21 and the intermediate space 22.

The property of the separating wall 20 to act as a diffusion barrier or a vapor barrier is based on the pressure dependency of free path length: at almost normal pressure (700-1000 mbar), the diffusion is inhibited by the relatively small opening(s) of the separating wall 20. In contrast, when the intermediate space 22 is evacuated to pressures in the pre-vacuum range (10-1000 µbar), the free path length is greatly increased and the separating wall 20 then represents only a weak diffusion barrier for the gas exchange. The process space 21 can thus be pumped out through the separating wall 20 and, after the pumping out, process gas can also flow into the process space 21 via an inlet into the intermediate space 22. On the other hand, by means of the separating wall 20, the partial pressure of readily volatile chalcogen components, such as selenium or sulfur, which diffuse/evaporate out of the coated substrate during the heat treatment, can be kept at least largely constant in the process space 21 during the heat treatment of the substrate. The separating wall 20 thus acts, for example, as a selenium barrier during the heat treatment of the coated substrate.

Generally speaking, a (common) opening area 25 of the gap 23 or slots 24 is dimensioned such that, during the heat treatment of the substrate, a mass loss of a gaseous substance generated by the heat treatment of the coated substrate out of the process space 21 is less than 50%, preferably less than 20%, more preferably less than 10%, of the mass of the gaseous substance generated in the process space 21 during the heat treatment. For this purpose, the separating wall 20 is implemented such that an area ratio, formed from the opening area 25 divided by an internal surface or inner surface 26 of the process space 21, is in the range from $5 \times 10^{-5}$ to $5 \times 10^{-4}$.

For example, the inner surface 26 of the process space 21 has a size of ca. 1.2 m². A mean gap height of the gap 23 is, for example, in the range from 50 to 100 µm, corresponding to an opening area 25 in the range from 2 to 5 cm². The separating wall 20 has, for example, a height of of 9 mm. These values yield an area ratio of $1.5 \times 10^{-4}$.

By means of the separating wall 20 serving as a vapor barrier or diffusion barrier, a diffusion of volatile components developing in the process space 21 during the thermal processing into the intermediate space 22 can at least be largely suppressed such that a condensation of the volatile components on the temperature-controlled (actively cooled) side wall 7, here, specifically the seal 9, is prevented. The process atmosphere in the process space 21 can thus be kept at least approximately constant.

As illustrated in FIG. 1, the intermediate space 22 is situated at least partially, in particular completely, outside a (common) radiation field of the radiant heaters 12 such that during the heat treatment a temperature gradient is formed in the intermediate space 22 from the separating wall 20 to the temperature-controlled (actively cooled) side wall 7, here, specifically the seal 9. This temperature gradient serves as a "temperature barrier" for protection of vacuum-compatible components of the process box 1 against high thermal stress. For this purpose, the radiant heaters 12 are arranged exclusively above or below the process space 21 in front of or up to the separating wall 20. The radiant heaters 12 end in each case at least a few centimeters in front of the intermediate space 22 or separating wall 20. On the other hand, the radiant heaters 12 are arranged such that a rising temperature gradient is formed such that a desired process temperature for heat treating the coated substrate 2 is obtained starting from the side wall 7, specifically seal 9, to the separating wall 20 in front of or at least at the level of the separating wall 20 in order to ensure an adequate conversion of the precursor layers of the substrate into compound semiconductors.

In the general embodiment illustrated in FIG. 1, the separating wall 20, the intermediate space 22, and the temperature-controllable or coolable section(s) of the side wall 7 can be designed laterally in one direction, in two directions, or peripherally (frame). In the embodiment of FIG. 2, the separating wall 20, the intermediate space 22, and the temperature-controllable or coolable section of the side wall 7 (seal 9) are realized only in one spatial direction.

Figure 3:
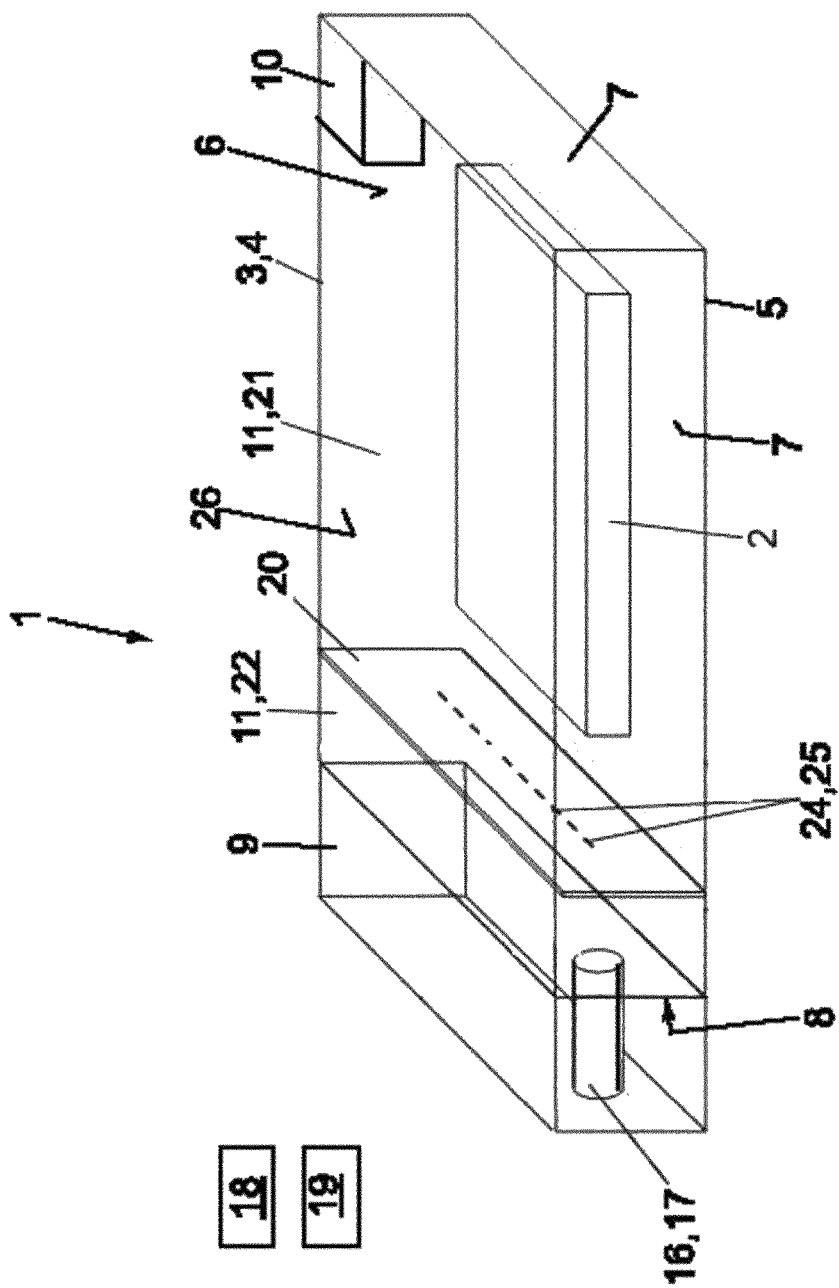
FIG. 3 a variant of the device of FIG. 2.

FIG. 3 illustrates a variant of the device 1, in which only the differences relative to the device of FIGS. 1 and 2 are explained and, otherwise, reference is made to the statements concerning this.

Accordingly, the device 1 is at the tempering furnace independently heatable and includes, for this purpose, a heating device 10, which, for example, is (only) accommodated in the process space 21. The heating device 10 is, for example, implemented as an electric (resistance) heater. Heating of the object 2 by radiant heater 12 is not provided. Accordingly, the housing 3 can also be made of a homogeneous material, for example, ceramic, quartz, or metal. Moreover, temperature control of the seal 9 is not provided. For example, a sensor (not shown), which should be protected from the corrosive gases of the process space by the separating wall 12, is situated in the intermediate space 22.

Figure 4:
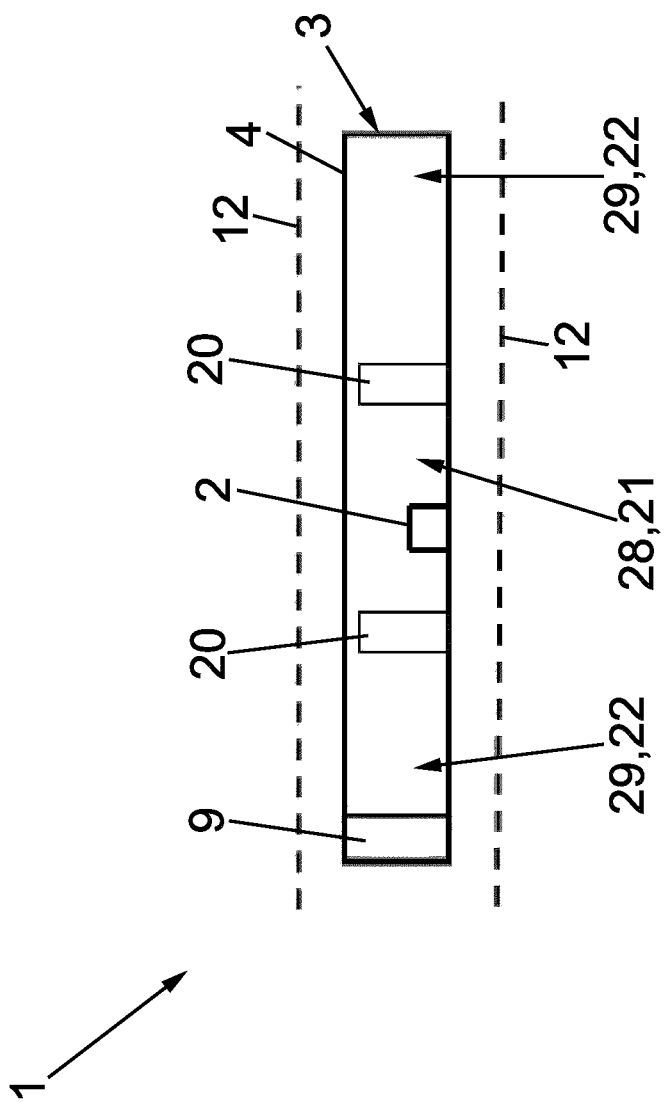
FIG. 4 a generalized cross-sectional representation of a device for processing any object.

FIG. 4 illustrates a generalized sectional representation of a device 1 according to the invention for processing any object 2, in which only the differences relative to the device of FIGS. 1 and 2 are explained and, otherwise, reference is made to the statements concerning this.

Accordingly, the device 1 is used for the processing, in particular coating of any object 2. The cross-section could, for example, represent a conventional zoned furnace with a plurality of heating zones, here, for example, an inner hot core zone 28 for processing the object 2, which is surrounded by two colder edge zones 29. The warmer core zone 28 also has, accordingly, a warmer housing wall 4 than the colder edge zones 29. The device 1 comprises, here, for example, a cylindrical housing 3 as part of a tempering furnace with a heating device 10, which comprises a resistance heater (not shown) and radiant heaters 12. The separating wall 20 separates, for example, the hottest core zone 28 of the zoned furnace, in which the object 2 rests, and the edge zones 29 from each other. A temperature control of the seal 9 is not provided in the device 1 of FIG. 4.

By means of the separating wall 20 serving as a vapor barrier or a diffusion barrier, diffusion of volatile components developing during the heat treatment in the core zone 28 into the edge zones 29 can be at least largely suppressed such that condensation of the volatile components on the colder housing wall 4 of the edge zones 29 is prevented.

Reference is now made to FIG. 5A-5F, in which different variants of the separating wall 20 of the device 1 according to the invention are illustrated. This is in each case a temperature-controlled separating wall 20, which is, for this purpose, made of a material that has a coefficient of thermal expansion such that a total opening area 25 of the respective openings or breaks is reduced by heating the separating wall 20 during the heat treatment to a maximum of 50%, preferably a maximum of 30%, more preferably a maximum of 10%, of the starting value (total opening area 25 before the heat treatment). The separating wall 20 is made, for this purpose, of a material with a coefficient of thermal expansion of more than $5 \times 10^{-6}$ K$^{-1}$. Examples for this are certain glass ceramics with a coefficient of thermal expansion of $9 \times 10^{-6}$ K$^{-1}$, aluminum oxide ($Al_2O_3$) with a coefficient of thermal expansion in the range from $6.5 \times 10^{-6}$ K$^{-1}$ to $9 \times 10^{-6}$ K$^{-1}$, zirconium oxide and magnesium oxide with a coefficient of thermal expansion in the range from $10 \times 10^{-6}$ K$^{-1}$ to $13 \times 10^{-6}$ K$^{-1}$. The material of the separating wall 20 must also be temperature resistant and corrosion resistant.

Figure 5A:
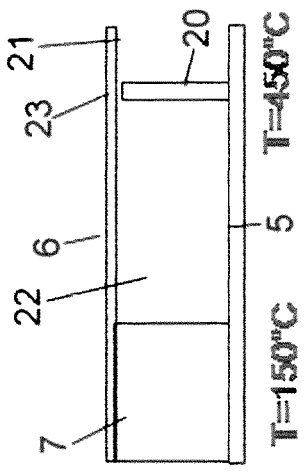
FIG. 5A-5F different variants of a temperature-controlled separating wall of the device of FIGS. 1 to 4.
Figure 5B:
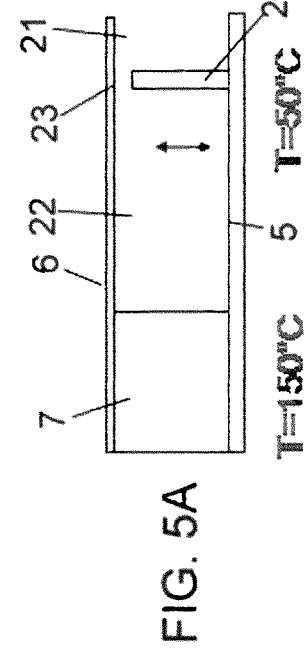

FIGS. 5A and 5B depict the separating wall 20 of the process box 1 implemented as a vertical strip, in each case in a vertical sectional representation. Accordingly, the separating wall 20 does not extend all the way to the top wall 6 such that the gap 23 remains as an opening for the fluidic connection of the process space 21 and the intermediate space 22. FIG. 5A depicts a situation in which the side wall 7 is temperature controlled to a temperature of T=150° C., whereas the separating wall 20 has a temperature of T=50° C. The material of the separating wall 20 is relatively cold; the gap 23 is wide open. The vertical dimension or mean gap height (clear width) of the gap 23 is in the range from 50 to 100 μm with a height of the separating wall 20 of ca. 10 mm. During heating, the material of the separating wall 20 expands relatively dramatically, with the mean gap height decreasing (FIG. 5B). For example, with heating of the separating wall 20 to a temperature of T=450° C. (temperature difference 400° C.), a change in the vertical dimension of the separating wall 20 of ca. 40 μm is attained such that the mean gap height of the gap 23 decreases to a value in the range from 10 to 50 μm, i.e., a maximum of 50% of the starting value.

In this case, it is essential that the height of the process space 21 is enlarged less by thermal expansion than the gap 23. This can, for example, be achieved in that the material of the process space 21 in FIG. 2 consists of quartz glass (coefficient of thermal expansion $5 \times 10^{-7}$/K) or another material with a coefficient of thermal expansion less than $1 \times 10^{-6}$/K. Alternatively, as depicted in the configuration of in accordance with FIG. 1, the height of the housing 3 can be kept constant by the temperature control of the sidewall 7.

Figure 5C:
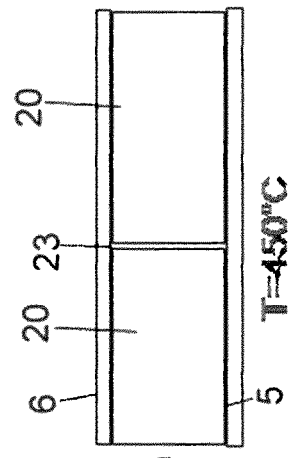
Figure 5D:
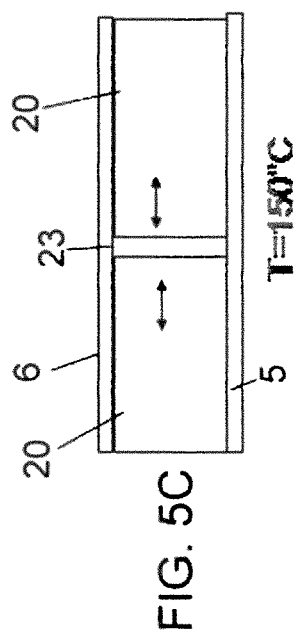

FIGS. 5C and 5D depict a variant with reference to a view of the separating wall 20. To avoid unnecessary repetitions, only the differences relative to FIGS. 5A and 5B are explained, and, otherwise, reference is made to the statements there. Accordingly, the strip-shaped separating wall 20 extends from the bottom wall 5 to the top wall 6, with one or a plurality of vertical gaps 23 implemented in the form of breaks of the separating wall 20. The gap width measured in the horizontal direction is in the range from 50 to 100 μm (FIG. 5C). By means of a dimensioning of the separating wall region between two gaps 23 greater compared to the height of 10 m, relatively greater travel, which can, for example, amount to several 100 μm, can be obtained with heating of the separating wall 20 to a temperature of, for example, T=450° C. In particular, the total opening area of the gaps 23 can be reduced to, for example, a maximum of 50% of the starting value.

Figure 5E:
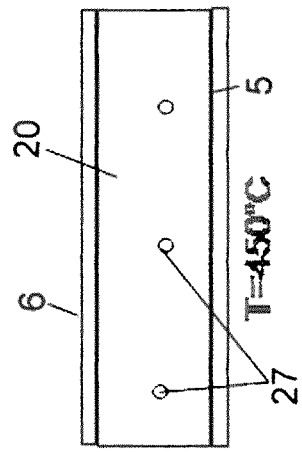
Figure 5F:
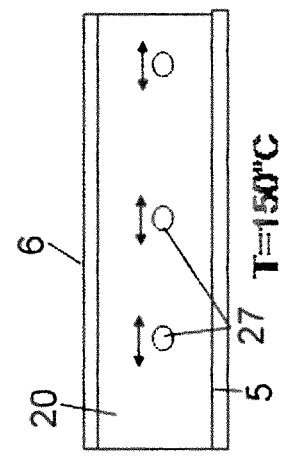

FIGS. 5E and 5F depict another variant with reference to a view of the separating wall 20. To avoid unnecessary repetitions, again only the differences relative to FIGS. 5A and 5B are explained, and, otherwise, reference is made to the statements there. Accordingly, a plurality of round holes 27 are provided instead of a gap 23, which are in each case implemented in the form of perforations of the separating wall 20. Starting from a situation in which the temperature of the separating wall 20 is, for example, T=150° C. (FIG. 5E), a reduction of the diameter of the opening of the round holes 37 can be obtained by means of heating the separating wall 20 to a temperature of, for example, T=450° C. (FIG. 5F). In particular, the entire opening area of the round holes 27 can be reduced to, for example, a maximum of 50% of the starting value.

LIST OF REFERENCE CHARACTERS

1 device
2 object
3 housing
4 housing wall
5 bottom wall
6 top wall
7 sidewall
8 housing opening
9 seal 10 heating device
11 hollow space
12 radiant heater
13, 13' coolant connection
14 cooling device
15 valve
16 gas passage
17 gas connection
18 pumping-out device
19 gas supply device
20 separating wall
21 process space
22 intermediate space
23 gap
24 slot
25 opening area
26 inner surface
27 round hole
28 core zone
29 edge zone

The invention claimed is:

1. Device for heat treating an object, such as a coated substrate, comprising one housing that encloses a hollow space, wherein the hollow space has a separating wall, by means of which the hollow space is divided into a process space for accommodating the object and an intermediate space, wherein the separating wall has one or a plurality of openings, which are implemented such that the separating wall acts as a diffusion barrier for a gas exchange between the process space and the intermediate space during the heat treating of the object and enables a gas exchange between the process space and the intermediate space through the separating wall before and after the heat treating of the object, wherein the housing has at least one coolable first housing section coupled with a cooling device for its active cooling, wherein the separating wall is arranged between the object and the coolable first housing section, and wherein the housing further comprises at least one second housing section which is implemented such that the object is heat treatable by means of electromagnetic thermal radiation impinging on the housing, or at least one second housing section coupled to a heating device for heating the process space, with the second housing section being different from the first housing section, wherein the first housing section has a sealable gas passage opening into the intermediate space for removing or feeding or both of at least one gaseous substance.

2. Device according to claim 1, wherein the separating wall is implemented such that a mass loss of the gaseous substance during the heat treatment is less than 50%, wherein an area ratio, formed from a total opening area of the one or a plurality of openings divided by an inner surface of the process space, is in the range from $5\times10^{-5}$ to $5\times10^{-4}$.

3. Device according to claim 1, wherein the separating wall contains a material, which has such a coefficient of thermal expansion that a total opening area of the one or a plurality of openings is reduced by heating the separating wall during the heat treatment to a maximum of 50% of a total opening area before the heat treatment.

4. Device according to claim 3, wherein the separating wall contains a material, whose coefficient of thermal expansion is greater than $5\times10^{-6}K^{-1}$.

5. Device according to claim 1, wherein the housing is made of a material, whose coefficient of thermal expansion is less than $5\times10^{-\neq}K^{-1}$.

6. Device according to claim 1, wherein the separating wall is arranged between a warmer zone and at least one colder zone of the hollow space.

7. Device according to claim 1, wherein the housing section coupled to a cooling device is a side wall section of the housing, which includes a seal for sealing a housing opening.

8. Device according to claim 1, wherein the separating wall does not reach a housing wall, wherein an opening remains between the separating wall and the housing wall.

9. Device according to claim 1, wherein the housing is made of quartz glass.

10. Device according to claim 2, wherein a mass loss of the gaseous substance duringthe heat treatment is less than 20%.

11. Device according to claim 2, wherein a mass loss of the gaseous substance during the heat treatment is less than 10%.

12. Device according to claim 3, wherein a total opening area of the one or a plurality of openings is reduced by heating the separating wall during the heat treatment to a maximum of 30% of a total opening area before the heat treatment.

13. Device according to claim 3, wherein a total opening area of the one or a plurality of openings is reduced by heating the separating wall during the heat treatment to a maximum of 10% of a total opening area before the heat treatment.

14. Method for heat treating an object, such as a coated substrate, the method comprising:
   introducing an object into a hollow space of one housing, wherein the hollow space is divided by a separating wall, which has one or a plurality of openings, into a process space accommodating the object and an intermediate space,
   heat treating the object, wherein the separating wall acts as a barrier for the diffusion out of the process space into the intermediate space of a gaseous substance generated in the process space by the heat treatment of the object,
   cooling at least one housing section delimiting the intermediate space during the heat treatment of the object.

15. The method of claim 14, wherein the separating wall has such a coefficient of thermal expansion, that a total opening area of the one or a plurality of openings is reduced by heating the separating wall during the heat treatment of the object to a maximum of 50% of a total opening area before the heat treatment, wherein the separating wall contains in particular a material with a coefficient of thermal expansion of more than $5\times10^{-6}K^{-1}$.

16. Method according to claim 14, wherein the process space is pumped out by removal of at least one gaseous substance from the intermediate space and/or at least one gaseous substance is fed to the process space by introduction into the intermediate space.

* * * * *

UNITED STATES PATENT AND TRADEMARK OFFICE
CERTIFICATE OF CORRECTION

Page 1 of 1

PATENT NO. : 10,163,670 B2
APPLICATION NO. : 14/413562
DATED : December 25, 2018
INVENTOR(S) : Fürfanger et al.

It is certified that error appears in the above-identified patent and that said Letters Patent is hereby corrected as shown below:

In the Claims

Column 14, Line 3, in part, should read:
-- $5 \times 10^{-6} K^{-1}$ --; and

Column 14, Line 18, in part, should read:
--during the--.

Signed and Sealed this
Eighth Day of October, 2019

Andrei Iancu
*Director of the United States Patent and Trademark Office*